(12) United States Patent
Pierson

(10) Patent No.: US 6,569,710 B1
(45) Date of Patent: May 27, 2003

(54) PANEL STRUCTURE WITH PLURALITY OF CHIP COMPARTMENTS FOR PROVIDING HIGH VOLUME OF CHIP MODULES

(75) Inventor: Mark V. Pierson, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/205,407

(22) Filed: Dec. 3, 1998

(51) Int. Cl.[7] .................... H01L 21/44; H01L 21/48; H01L 21/50
(52) U.S. Cl. .................. 438/110; 438/108; 257/685
(58) Field of Search ................ 438/108, 110, 438/118, 121, 124–127, 113, 114, 458; 257/685, 723–725, 734, 774, 784

(56) References Cited

U.S. PATENT DOCUMENTS

| 3,401,126 | A | | 9/1968 | Miller et al. ................ 252/514 |
|---|---|---|---|---|
| 3,429,040 | A | | 2/1969 | Miller ......................... 29/840 |
| 3,915,780 | A | | 10/1975 | Broussard, Jr. et al. ...... 156/243 |
| 4,604,644 | A | | 8/1986 | Beckham et al. ............ 257/737 |
| 4,966,857 | A | | 10/1990 | Haghiri-Tehrani et al. .. 156/293 |
| 5,447,886 | A | * | 9/1995 | Rai ......................... 228/180.22 |
| 5,491,111 | A | * | 2/1996 | Tai .............................. 438/15 |
| 5,536,765 | A | | 7/1996 | Papathomas ................ 524/100 |
| 5,612,513 | A | * | 3/1997 | Tuttle et al. ................ 174/260 |
| 5,861,654 | A | * | 1/1999 | Johnson ..................... 257/433 |
| 5,866,943 | A | * | 2/1999 | Mertol ....................... 257/712 |
| 5,869,353 | A | * | 2/1999 | Levy et al. ................. 438/109 |
| 5,923,958 | A | * | 7/1999 | Chou ........................ 438/118 |
| 6,020,219 | A | * | 2/2000 | Dudderar et al. .......... 438/118 |
| 6,087,202 | A | * | 6/2000 | Exposito et al. ........... 438/113 |
| 6,100,108 | A | * | 8/2000 | Mizuno et al. .............. 438/51 |
| 6,316,289 | B1 | * | 11/2001 | Chung ....................... 438/118 |

FOREIGN PATENT DOCUMENTS

JP  61082447  *  4/1986

\* cited by examiner

Primary Examiner—Carl Whitehead, Jr.
Assistant Examiner—Jamie L. Brophy
(74) Attorney, Agent, or Firm—Connolly Bove Lodge & Hutz, LLP; Lawrence R. Fraley, Esquire

(57) ABSTRACT

A method of forming a plurality of individual semiconductor chip modules wherein a plurality of chips are placed in a plurality of chip compartments formed by adhering a support panel to the first surface and a cover panel to the second surface of a stiffener panel having openings defining sidewalls of the chip compartments. The resulting laminated panel structure is then cut into a plurality of modules each having at least one compartment containing at least one chip. Each chip is electrically connected to interior conductive pads on the inner surface of the support panel, and these interior pads in turn are connected by conductive paths to exterior conductive terminals deposited on the outer surface of the support panel. The electrical connections between the chip and the interior conductive pads of the support panel may be encapsulated in a polymeric material before the cover panel is adhered to the stiffener panel.

11 Claims, 4 Drawing Sheets

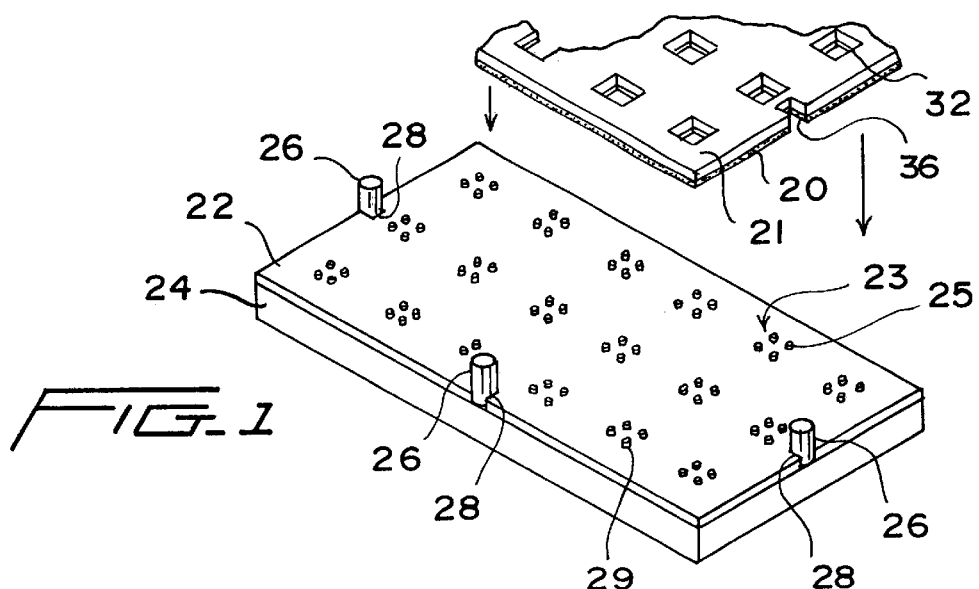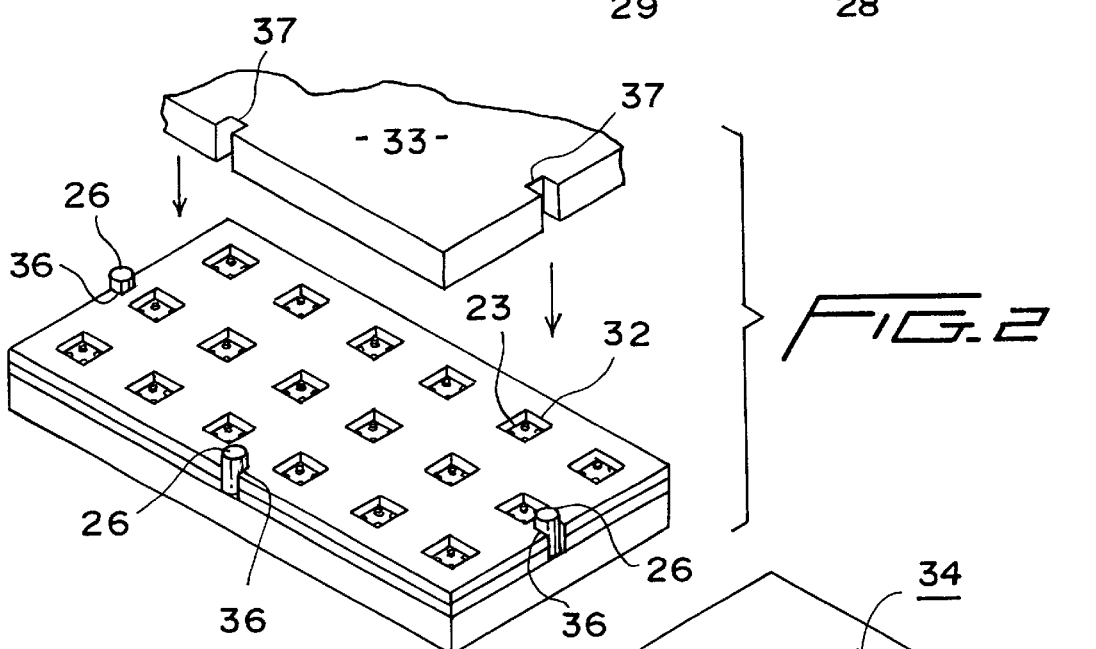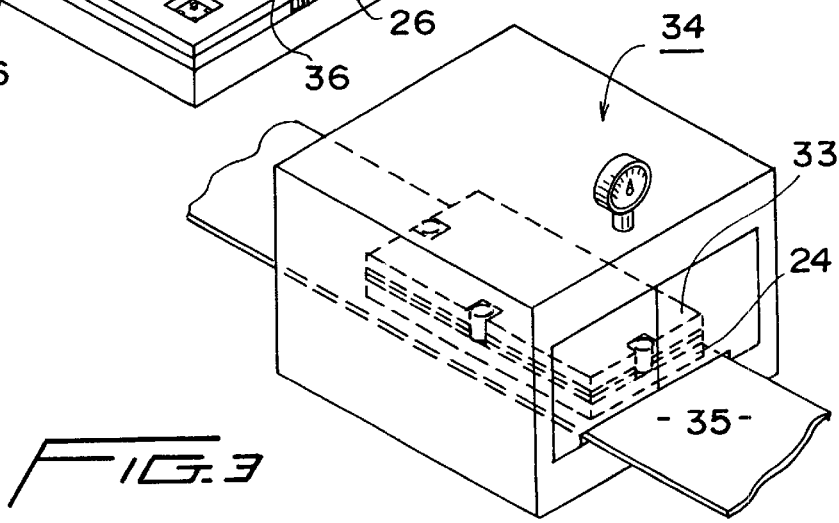

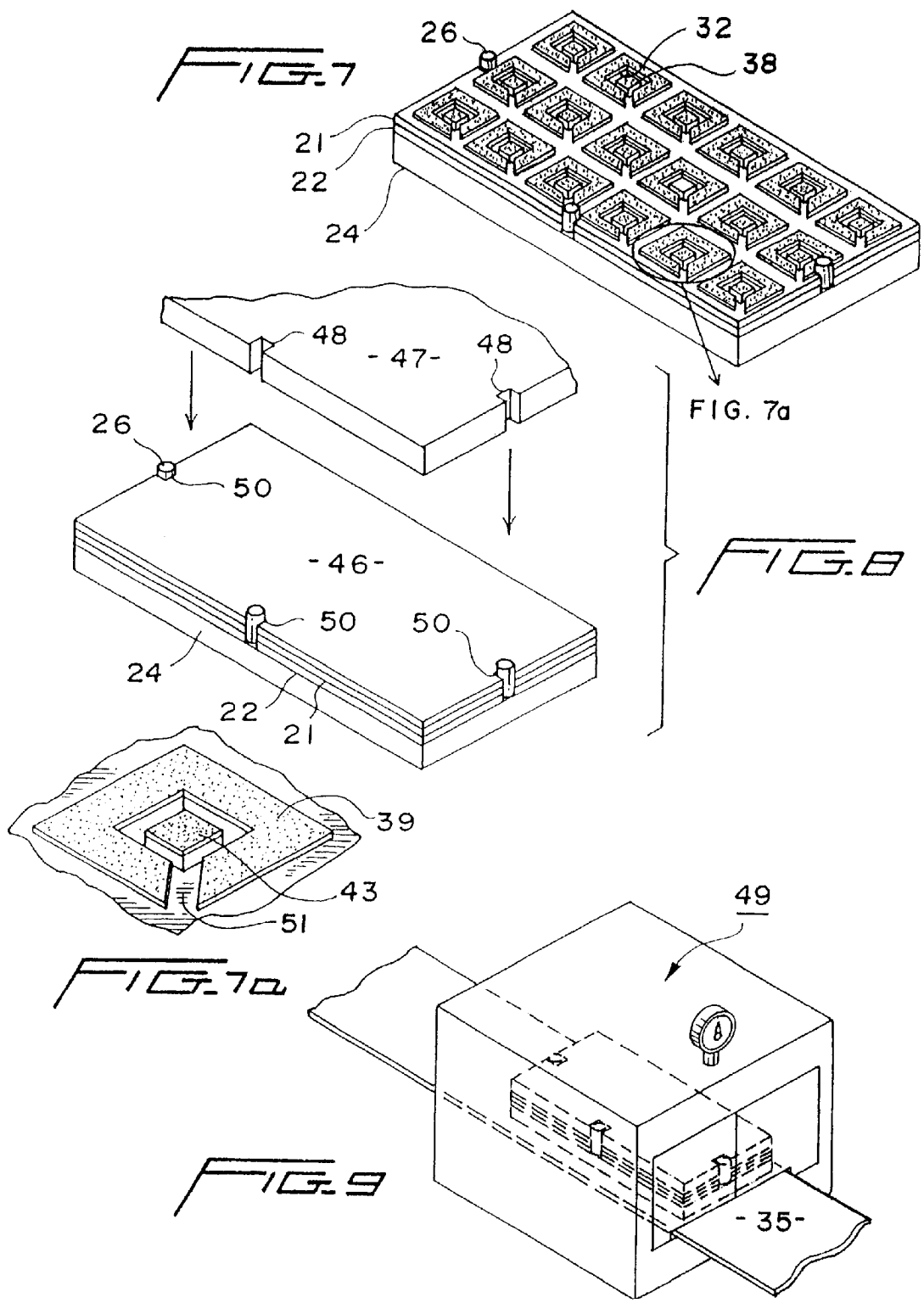

PANEL STRUCTURE WITH PLURALITY OF CHIP COMPARTMENTS FOR PROVIDING HIGH VOLUME OF CHIP MODULES

TECHNICAL FIELD

The present invention generally relates to interconnection structures for joining an integrated semiconductor device or "chip" to a carrier substrate of organic nature. More particularly, the present invention concerns an interconnection structure separable into a plurality of individual chip modules, and a method of making the interconnection structure and a high volume of the individual modules. The present invention is especially concerned with "controlled collapse chip connection" or "C4" structures that employ solder-bump interconnections, which is also referred to as "face down" or "flip-chip" bonding.

BACKGROUND ART

Controlled collapse chip connection (C4) or flip-chip technology has been successfully used for over twenty-five years for interconnecting high I/O (input/output) count and area array solder bumps on silicon chips mounted to base ceramic chip carriers, for example alumina carriers. The solder bump, typically a 95 Pb/5 Sn alloy, provides the means of chip attachment to the ceramic chip carrier for subsequent usage and testing. For example, see U.S. Pat. Nos. 3,401,126 and 3,429,040 to Miller and assigned to the assignee of the present disclosure, for a further discussion of the controlled collapse chip connection (C4) technique of face down bonding of semiconductor ships to a carrier. Typically, a malleable pad of metallic solder is formed on the semiconductor device contact site and solder joinable sites are formed on the chip carrier.

The solder joinable sites on the carrier are surrounded by non-solderable barriers so that when the solder on the semiconductor device contact sites melts, surface tension of the molten solder prevents collapse of the joints and thus holds the semiconductor device (chip) suspended above the carrier. With the development of the integrated circuit semiconductor device technology, the size of individual active and passive elements have become very small, and the number of elements in the device has increased dramatically. This results in significantly larger chip sizes with larger numbers of I/O terminals. This trend will continue and will place increasingly higher demands on device forming technology. An advantage of solder joining a device to a substrate is that the I/O terminals can be distributed over substantially the entire surface of the semiconductor device. This allows efficient use of the entire surface, which is more commonly known as area bonding.

Usually the integrated circuit semiconductor chips are mounted on supporting substrates made of materials with coefficients of expansion that differ from the coefficient of expansion of the material of the semiconductor chip, e.g., silicon. Normally, the chip is formed of monocytstalline silicon with a coefficient of expansion of $2.6 \times 10^{-6}$ per $°$ C. and the substrate is formed of a ceramic material, typically alumina with a coefficient of expansion of $6.8 \times 10^{-6}$ per $°$ C. In operation, the active and passive elements of the integrated semiconductor chip inevitably generate heat resulting in temperature fluctuations in both the chips and the supporting substrate since the heat is conducted through the solder bonds. The chips and the substrate thus expand and contract in different amounts with temperature fluctuations, due to the different coefficients of expansion. This imposes stresses on the relatively rigid solder terminals.

The stress on the solder bonds during operation is directly proportional to (1) the magnitude of the temperature fluctuations, (2) the distance of an individual bond from the neutral or central point (DNP), and (3) the difference in the coefficients of expansion of the material of the semiconductor device and the substrate, and is inversely proportional to the height of the solder bond, that is the spacing between the device and the supporting substrate. The seriousness of the situation is further compounded by the fact that as the solder terminals become smaller in diameter in order to accommodate the need for greater density, the overall height decreases.

The disclosure of an improved solder interconnection structure with increased fatigue life can be found in U.S. Pat. No. 4,604,644 to Beckham et al., and assigned to the assignee of the present disclosure, the entire contents of which are incorporated herein by reference. In particular, U.S. Pat. No. 4,604,644 discloses a structure for electrically joining a semiconductor device to a support substrate that has a plurality of solder connections where each solder connection is joined to a solder wettable pad on the support substrate. A dielectric organic material is disposed between the peripheral area of the device and the facing area of the substrate, and this material surrounds and encapsulates at least one outer row and column of solder connections but leaves the solder connections in the central area of the device free of the dielectric organic material. The dielectric material is typically applied by first mixing it with a suitable solvent and then dispensing it along the periphery of the device where it can be drawn in between the device and substrate by capillary action.

Encapsulants that exhibit, among other things, improved fatigue life of C4 solder connections are disclosed in U.S. Pat. No. 4,999,699 to Christie et al. and assigned to the assignee of the present disclosure, the entire contents of which are incorporated herein by reference. In particular, U.S. Pat. No. 4,999,699 discloses a curable composition containing a binder which is a cycloaliphatic polyepoxide and/or a cyanate ester or prepolymer thereof and a filler. U.S. Pat. No. 5,121,190 to Hsiao et al. and assigned to the assignee of the present disclosure, the entire contents of which are incorporated herein by reference, discloses providing C4 solder connections for an integrated semiconductor device on an organic substrate. The compositions disclosed therein are curable compositions containing a thermosetting binding and filler. The binder employed has viscosity at normal room temperatures (25° C.) of no greater than about 1,000 centipoise. Suitable binders disclosed therein include polyepoxides, cyanate esters and prepolymers thereof.

In addition, U.S. Pat. No. 5,536,765 to Papathomas and assigned to the assignee of the present disclosure, the entire contents of which are incorporated herein by reference, discloses compositions that exhibit excellent wetting and coverage of the C4 connections as well as the pin heads under the device that are present. In fact, these compositions make it possible to achieve complete coverage beneath the chip. These compositions, which include a triazine polymer that is a reaction product of (a) monocyanate and (b) dicyanate and/or a prepolymer thereof, are of relatively low viscosity prior to curing and thereby exhibit even and adequate flow under the semiconductor device. The solder interconnection for forming connections between an integrated semiconductor device and a carrier substrate includes a plurality of solder connections that extend from the carrier substrate to electrodes on the semiconductor device to form a gap between the carrier substrate and the semiconductor device. The gap is filled with a composition obtained from curing the disclosed composition.

The techniques described above enable chips to be attached directly on the surface of a board thereby eliminating an intermediate chip carrier. Although these techniques have been quite successful, there still remains room for improvement, especially with respect to the handling and rate of producing modules with organic base panels, such as those made of Teflon. Organic based modules are very prone to handling damage when assembled individually in accordance with past practices. Individual assembly is also costly per module because of the amount of handling and manipulation required to assemble each small module element one at a time, resulting in low yields of the assembled modules.

SUMMARY OF INVENTION

The present invention overcomes the foregoing problems of the prior art in that it provides a method and structure for producing a plurality, e.g., 80 to 100, individual organic based modules from a single composite panel formed as a laminate of relatively large individual panel elements. The composite panel contains a plurality of compartments each housing one or more chips, and this composite panel is then cut into individual modules each having one or more compartments. The present disclosure thereby provides a method and structure for producing individual chip modules in high yields at relatively low costs per module. Damage to the modules produced is also greatly reduced because handling and manipulation of the small module elements and of the assembled modules are minimized.

The advantageous method of the invention includes the following steps. An organic base panel, such as one made of Teflon and having small terminal pads with solder stubs on its upper side, is placed on a carrier plate having three locator pins. A metal stiffener panel is placed on the upper side of the organic base panel with a silicone based adhesive therebetween. The stiffener panel is preferably made of metal and has a plurality of openings to define compartments for later housing one or more chips. A clamping plate is then fastened to the carrier plate to keep the two module panels flat and to squeeze the silicone adhesive to the proper thickness as it is cured by placing the clamped structure in an oven. The two module panels and the clamping plate each have three slots at appropriate locations for receiving the locator pins to precisely position the panels and plates relative to each other.

Upon removal from the oven, the chip site defined by the openings in the stiffener panel is fluxed with a solder fluxing composition, at least one chip with a plurality of solder balls on its down side is placed in each cavity formed when one side of each stiffener opening was closed by the base panel, and the resulting C4 solder joints are then reflowed to bond each chip to the base panel. Each chip is then encapsulated in a polymeric material.

After curing of the encapsulating material, a cover panel is placed on the upper side of the stiffener panel with a silicone based adhesive therebetween. The cover panel also has three slots and is precisely located with the three locator pins. A second clamping plate is fastened to the resulting stacked structure to squeeze the adhesive to the correct dimension, and this clamped structure is placed in an oven to cure the adhesive. After removal from the oven, the second clamping plate and the carrier plate are removed, and the laminated composite panel is flipped over. A tacky flux and then solder balls are placed over exterior pads connected by conductive tracks to the interior terminal pads. The whole assembly is then further heated to reflow the solder balls so as to attach them to the exterior pads and form solder terminals on the exterior surface of the composite panel for connecting each chip to an electrical circuit for use therein.

The composite panel is then cut into individual chip modules each having one or more compartments, each of which houses one or more chips. As already described, the individual panels and plates each have three slots for receiving the three locator pins on the carrier plate. Similarly, the laminated composite panel has three corresponding slots for receiving three locator pins on a dicing saw table so as to precisely position the composite panel for cutting it into individual modules without breaching a chip compartment.

BRIEF DESCRIPTION OF THE DRAWINGS

The invention, both as to its structure and method, may be further understood by reference to the detailed description below taken in conjunction with the accompanying drawings in which:

FIG. 1 is an exploded perspective view showing a stiffener panel above a chip base panel (circuit board) on a carrier plate;

FIG. 2 is an exploded perspective view showing a clamping plate above a stiffener panel and a base panel on the carrier plate of FIG. 1;

FIG. 3 is a perspective view showing oven heating of the stacked assembly of FIG. 2;

FIG. 7 is a perspective view showing adhesive applied to the structure of FIG. 6;

FIG. 7A is an enlargement of the area shown within the circle 7A of FIG. 7;

FIG. 8 is an exploded perspective view showing a clamping plate above a cover panel, a stiffener panel and a base panel on the carrier plate of FIG. 1;

FIG. 9 is a perspective view showing oven heating of the stacked assembly of FIG. 8;

BEST AND VARIOUS MODES FOR CARRYING OUT THE INVENTION

Figure 4:
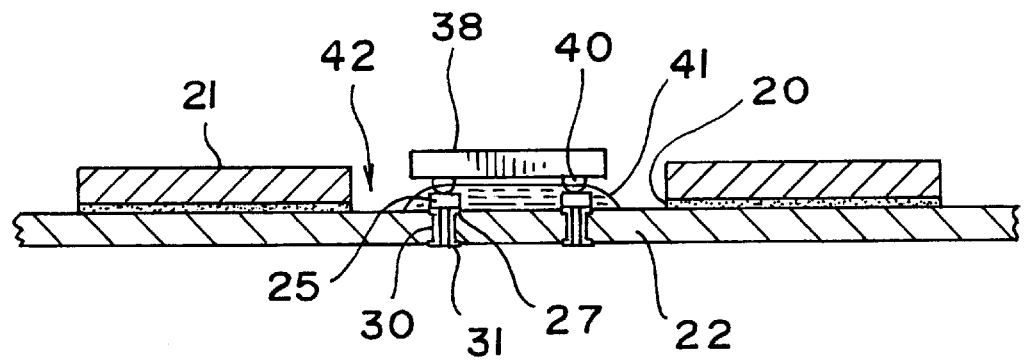
FIG. 4 is a sectional side view showing a chip ready to be soldered in a chip cavity of the structure of FIG. 2.

To facilitate a better understanding of the structure and method of the present invention, reference is made to FIG. 1 in which a silicone adhesive layer 20 has been screened, doctored or rolled onto a stiffener member or panel 21, preferably made of metal. A circuit board or base panel 22 is supported by a carrier plate 24, and may be composed of an organic material or some other dielectric material, and as a ceramic composition. The carrier plate also may be made of metal. Instead of placing adhesive layer 20 on stiffener panel 21, this layer may be screened or "imaged" onto the base panel 22 in areas surrounding the chip sites.

To facilitate precise positioning of the base panel 22 on the carrier plate 24, the latter is provided with three locator pins 26, each of which fits into a corresponding notch or slot 28 formed in the base panel. Three locator pins are preferably used instead of four to avoid jamming or pinching of the base panel 22 during thermal expansion thereof relative to the carrier plate.

By way of example, the base panel 22 may be made of glass, Teflon and epoxy resin, and the carrier plate 24 may be made of aluminum or stainless steel, such as series 300 stainless steel. Both the carrier plate and the base panel may have respective width and length dimensions of about 9×12 inches, with the carrier plate having a thickness of about 6 to 12 mm and the base panel having a thickness of about 0.5 mm. As will be described further below, a composite panel of these dimensions is capable of providing about 88 to 100 individual modules, each containing at least one chip (integrated circuit device) and having a rectangular shape measuring about 1 inch on a side. The panel 22 has previously been provided with a plurality of chip sites 23 each having a plurality of solder stubs 25, which have been pressed flat on a distal end and secured at a proximate end to an interior conductive pad 27 connected by a conductive path or via 30 (a hole with a conductive coating) to an exterior conductive pad 31 as may be seen in FIG. 4.

Referring now to FIGS. 2 and 3, the metal stiffener member 21 has a plurality of chip openings 32 and is laminated to base panel 22 by the adhesive layer 20 when the stiffener member and base panel are clamped between the carrier plate 24 and a clamping plate 33, and this clamped structure is then heated in a curing oven 34 to fully cure the adhesive. The clamping fasteners have been omitted from the drawings for clarity. The stiffener 21 preferably has the same width and length dimensions as the base panel 22 and may also have the same thickness, i.e., about 0.5 mm. The clamping forces between carrier plate 24 and clamping plate 33 also function to squeeze the layer 20 of uncured or partially cured silicone adhesive into a relatively thin adhesive film. Similar to the base panel 22, the stiffener member 21 has positioning slots 36, and the clamping plate 33 has positioning slots 37, for receiving the locator pins 26 so as to precisely align these elements with the base panel 22. As illustrated in FIGS. 3 and 9, one or more steps of the process described in the present disclosure may be carried out while the carrier plate 24 is being transported along an assembly line, either intermittently or continuously, such as by a conveyor 35.

Figure 5:
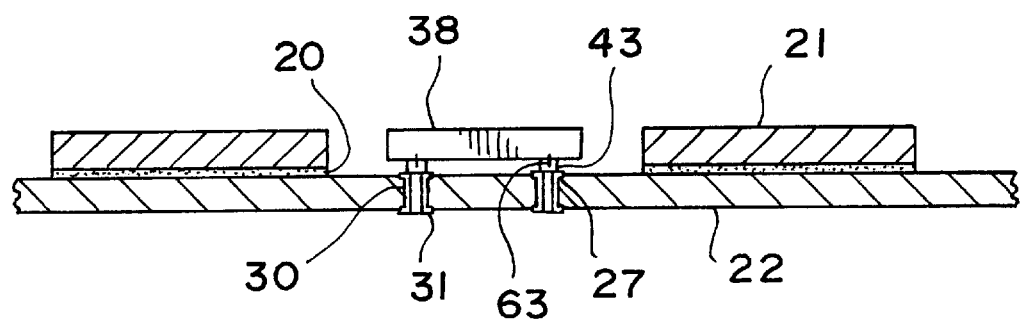
FIG. 5 is a sectional view similar to FIG. 4 after solder reflowing.
Figure 6:
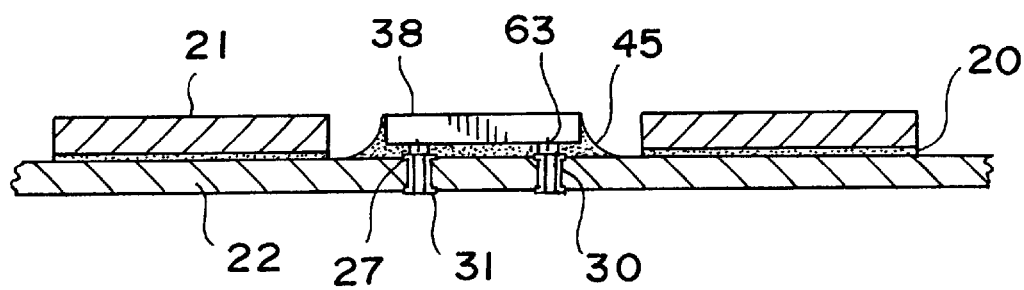
FIG. 6 is a sectional side view showing the chip of FIG. 5 encapsulated in a polymeric material.

As illustrated in FIGS. 4–6, after stiffener panel 21 is adhesively secured to base panel 22 with each chip site 23 coincident with one of the openings 32, the site is first cleaned by an oxygen plasma process to remove any silicone oils or other residual materials, and then fluxed by depositing thereon a liquid flux composition 41. Then, a chip 38 having a plurality of C4 solder balls 40 is placed in the cavity 42 formed when one side of the opening 32 is closed by the base panel 22. Each solder ball 40 is arranged to rest on a corresponding solder stub 25 connected to a conductive pad 27, which may be made of copper and is connected to the conductive via 30 leading to exterior terminal pad 31 as well known in the art.

The laminate is then further heated to cause the solder stubs only or both the solder stubs and balls, depending on the relative melting points, to reflow and bond the chip 38 to the conductive pads 27 on the inner surface of the base panel 22. The solder balls 40 are precisely placed or imaged onto the down side of the chip so as to interconnect the chip terminal pins 63 with the conductive solder stubs 25 on the base panel. The liquid chemical composition used to flux the chip site is chemically activated by heat to cause the melted solder balls 40 to wet the distal ends of the solder stubs 25 in the chip site area, and thereby form corresponding solder posts or columns 43 as shown in FIG. 5. The chip terminal pins are thereby connected to the external terminal pad 31 for electrically connecting the chip to external circuitry.

In other words, each chip terminal is placed in conductive contact with a copper pad 27 on the interior surface of panel 22, and a copper conductive via 30 (or a conductive path external to the panel 22) connects the interior pad 27 to an exterior copper pad 31 positioned to form an external module terminal. Thereafter, the electrical connections of each chip 38 with interior pads 27 are encapsulated in a polymeric material 45 as shown in FIG. 6 using known encapsulating techniques, such as that described in above referenced U.S. Pat. No. 5,536,765.

Figure 6A:
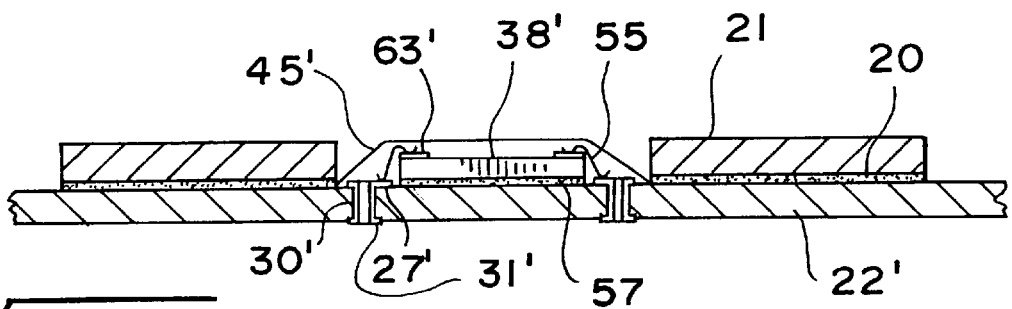
FIG. 6A is a sectional view similar to FIG. 6 but showing an alternative way of mounting a chip on a circuit board.

As an alternative to flip-chip bonding as described in the preceding three paragraphs, the chips may be wire bonded to the circuit board (base panel 22') as shown in FIG. 6A, wherein interior pads 27' are connected to chip terminals 63' along the upper edge of chip 38' by fine wires 55, and the bottom surface of chip 38' is secured to the base panel 22' by an adhesive layer 57. The chip and its electrical connections may then be encapsulated by a polymeric material 45' using known encapsulating techniques. A conductive via 30' connects interior pad 27' to an exterior pad 31'.

After the chip connections have been encapsulated as shown in FIG. 6, a silicone adhesive layer 44 may be screened or imaged onto the upper surfaces of stiffener member 21 and of each chip 38, as shown in FIGS. 7 and 7A. Instead of being applied as a continuous layer, the adhesive layer 44 is preferably screened to provide a center segment 43 on the upper surface of each chip and an annular segment 39 extending around each chip cavity 42 except for a gap 51. Spaces between adjacent annular segments 39 also provide exterior gaps 53 to the outside edge of stiffener panel 21. The gaps 51 and 53 allow better flow of the clamped adhesive and prevent air and/or water vapor entrapment by providing pathways for heated air and/or water vapor to escape.

The adhesive layer 44 may also be screened onto the interior surface of a cover panel 46. A further alternative is to doctor or roll the adhesive 44 as a continuous layer on either the stiffener panel 21 or the cover panel 46. Where adhesive layer 44 is continuous, a small hole should be drilled through the cover panel into each of the chip compartments described below to permit heated air and/or water vapor to escape.

Figure 11:
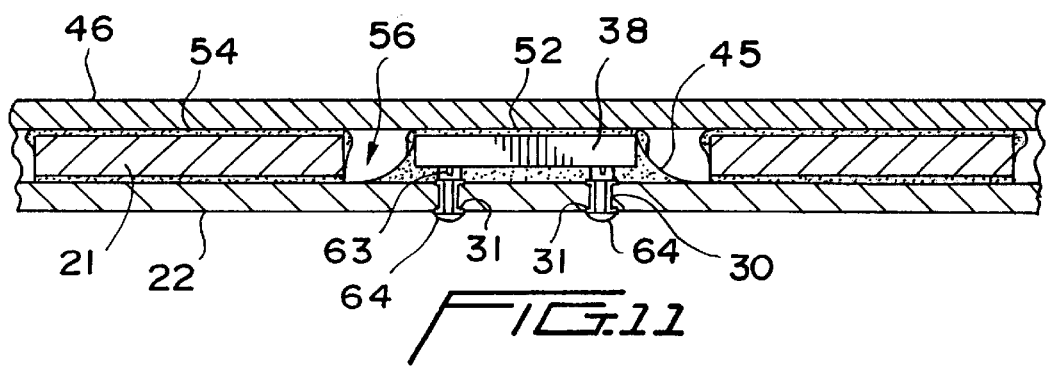
FIG. 11 is a fragmentary sectional view of the composite panel taken along lines 11—11 of FIG. 10; and, FIG. 12 is a diagrammatic perspective view illustrating cutting of a plurality of chip modules from the composite panel of FIG. 10.

Referring now to FIGS. 8 and 9, the cover panel 46 is placed on top of stiffener member 21, and the resulting laminate is squeezed between a clamping plate 47 and the carrier plate 24 to produce thin adhesive layers 52 and 54 on the chip and stiffener, respectively, and form a chip compartment 56, as may be seen in FIG. 11. The entire assembly then is heated in a curing oven 49 to cure these adhesive layers and thereby fix the cover panel 46 to the stiffener member 21. The clamping plate 47 also preferably includes slots 48 for receiving the locator pins 26 so that it is properly aligned with and fully covers the elements stacked on the carrier plate 24 as described above.

The cover panel 46 may have a thickness of 6 to 12 mm, and substantially the same width and length dimensions as the base panel 22. The cover panel 46 also includes a plurality of slots 50 for receiving the locator pins 26 to precisely locate the cover panel on the stiffener member 21. Cover panel 46 is preferably made of metal, more preferably copper, in order to provide good conduction of heat away from the chips 38, and for this purpose, an aluminum heat sink (not shown) with radiating fins may be mounted later on cover panel 46 over each chip compartment, either before or after separation of the individual modules.

Although the adhesive layers 52 and 54 securely fix the cover panel 46 to the stiffener member 21, the fastening together of these two elements preferably does not completely seal any of the resulting chip compartments or chambers 56 so that any moisture trapped within the chip compartments may readily escape during operation of the chip. Otherwise, such moisture could cause delamination of the cover panel or the base panel from the stiffener member.

Another important feature of the invention is that the height of the mounted chip 38 is preferably 0–0.1 mm greater than the combined thickness of the stiffener member and adhesive layer 20 to ensure that the adjacent surface of the chip is firmly in abutment with the cover panel 46 through adhesive layer 52 to facilitate the transfer of heat from the chip to the cover panel. It is also preferable that both the clamping plate 33 and the clamping plate 47 be of the same material as the carrying plate 24 so that these plates have the same thermal expansion coefficients, thereby avoiding an application of unequal clamping stresses that could cause warping of the intermediate or final laminates.

Figure 10:
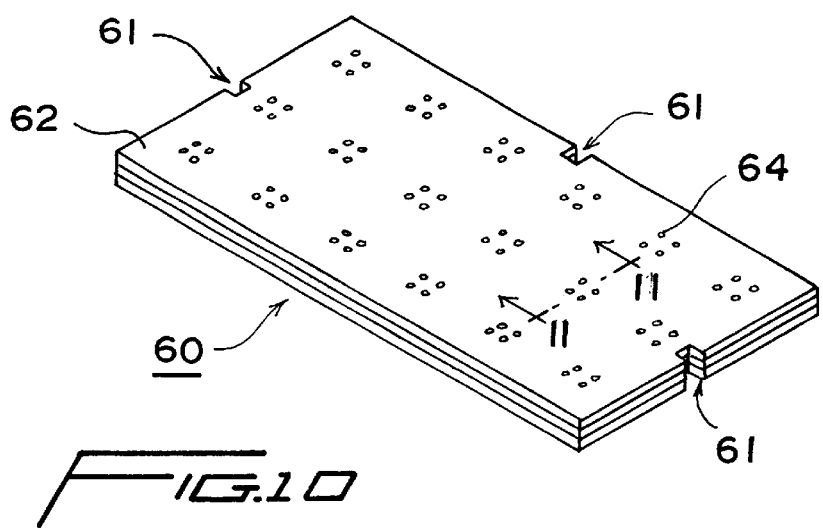
FIG. 10 is a perspective view showing the composite panel produced by the heating step of FIG. 9 and turned over with solder terminals added and reflowed after removal of the carrier plate and the clamping plate.

The above described process produces a laminated panel 60 having positioning slots 61 when the carrier plate 24 and the clamping plate 47 are removed. As illustrated in FIG. 10, the laminated panel 60 is then flipped over to expose its bottom surface 62, to which flux and solder balls are added and then reflowed by heat to form a plurality of exterior terminals 64, one on each exterior copper pad 31. To precisely locate the exterior solder balls, a notched stencil (not shown) is positioned by locator pins over bottom surface 62 of panel 60 on a support (not shown), and a viscous flux and one small solder ball is placed in each small opening of the stencil corresponding to an exterior pad 31. As previously mentioned, the terminal pads 31 are in electrical contact with conductive tracts 30, which are preferably internal to base panel 22, and thereby electrically connect each exterior terminal 64 to a corresponding chip terminal pin 63 as shown in FIG. 11.

Figure 12:
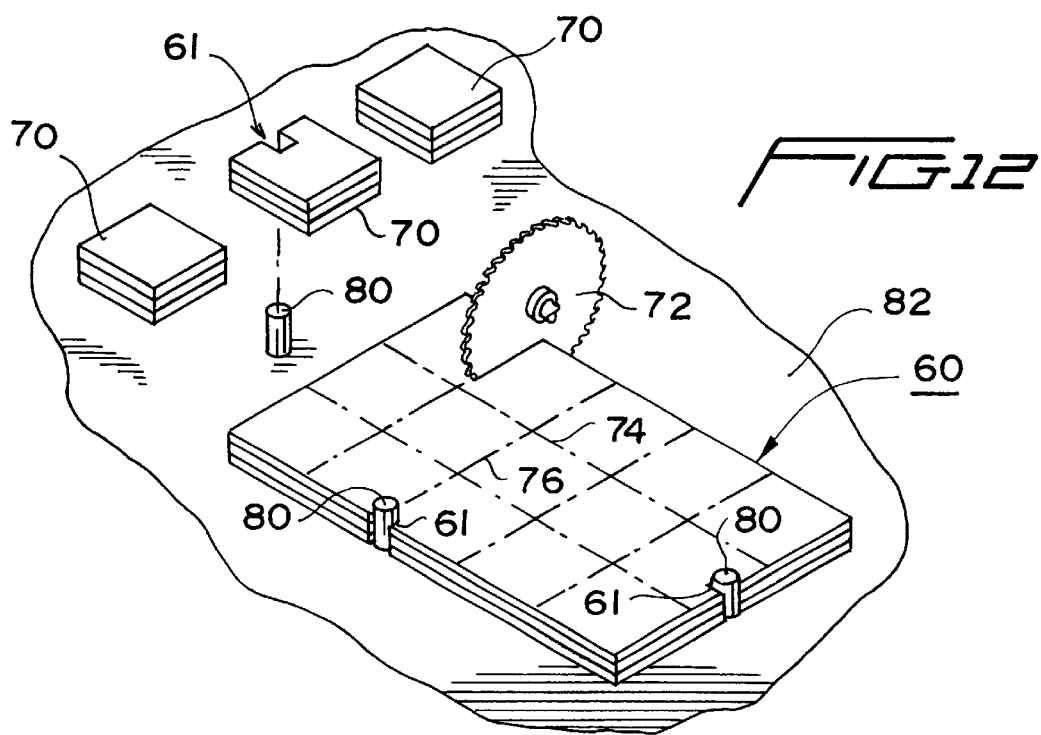

After formation of the exterior terminals 64, the laminated panel 60 is then cut into a plurality of individual chip modules 70 as illustrated in FIG. 12. In FIG. 12, there is shown diagrammatically a dicing saw 72 for separating the individual modules by cutting along a plurality of linear longitudinal paths 74 and a plurality of linear transverse paths 76. Other cutting implements, such as a laser or water jet, may be used instead of a dicing saw. Due to the manner in which it is formed, the completed panel 60 includes the positioning slots 61 that may receive locator pins 80 for precisely positioning the panel 60 on a cutting table 82 to ensure that the paths 74 and 76 are cut accurately along the sides of, but not through, each of the chip compartments 56.

Persons skilled in the art, upon learning of the present disclosure, will recognize that various modifications to the elements and the steps of the invention are possible without significantly affecting their functions. For example, the length and width dimensions, the thicknesses, and the materials of the elements described above, and the number of modules obtainable from a given panel structure, may be varied according to the equipment to be used in manufacturing the panel structure and the use to be made of the individual modules separated therefrom. Similarly, multiple chips may be provided in each compartment, and each separated module may comprise two or more compartments. It is also contemplated that one or more of the chips may be fastened to and encapsulated on a cover panel having conductive pads and tracks, instead of the base panel. Accordingly, while the preferred embodiments have been shown and described in detail by way of example, further modifications and embodiments are possible without departing from the scope of the invention as defined by the claims below.

What is claimed is:

1. A method of forming a module containing at least one semiconductor chip comprising:

providing a base panel, a middle panel and a cover panel, said base and cover panel having an inner surface and an outer surface, and said middle panel having a first surface and a second surface and a plurality of openings extending between said first surface and said second surface;

adhering a portion of the inner surface of said base panel to the first surface of said middle panel to form a plurality of cavities, each comprising a bottom wall provided by said base panel and an opening in the second surface of said middle panel;

mounting a plurality of semiconductor chips on the inner surface of said base panel at least one mounted chip being located at a chip site and being connected to at least one conductive element comprising a solder member bonding said mounted chip to a conductive pad at said chip site;

adhering the inner surface of said cover panel to the second surface of said middle panel and said chip with an adhesive to form a composite panel structure having a plurality of compartments, wherein the adhesive is provided with a gap to permit heated air or moisture to escape the chip compartment; and cutting said composite panel structure without breaching said chip compartments to form a plurality of chip modules.

2. A method according to claim 1, wherein the adhesive is a silicon adhesive.

3. A method according to claim 1, further comprising depositing exterior terminals of a solder material on the outer surface of the base panel at selected positions using a stencil with notches that coincide with locator pins, the exterior solder terminals being connected to the mounted chips by an electrical connection.

4. A method according to claim 1, further comprising supporting the base panel on a carrier plate with three pins and each pin is positioned on a different edge of the carrier plate, and the base panel and the middle panel each have three slots and each slot is positioned on a different edge of the base panel and middle panel, wherein the position of the three pins coincide with the position of the slots as the base panel is adhered to the middle panel.

5. A method according to claim 4, wherein the cover panel has three slots and each slot is positioned on a different edge of the cover panel, wherein the slots of the cover panel coincide with the pins of the carrier plate as the cover panel is adhered to the middle panel.

6. A method of forming a module containing at least one semiconductor chip comprising:

providing a base panel, a middle panel and a cover panel, said base and cover panel having an inner surface and an outer surface, and said middle panel having a first surface and a second surface and a plurality of openings extending between said first surface and said second surface;

adhering a portion of the inner surface of said base panel to the first surface of said middle panel to form a plurality of cavities, each comprising a bottom wall provided by said base panel and an opening in the second surface of said middle panel;

mounting a plurality of semiconductor chips on the inner surface of said base panel at least one mounted chip being located at a chip site and being connected to at least one conductive element comprising a solder member bonding said mounted chip to a conductive pad at said chip site;

adhering the inner surface of said cover panel to the second surface of said middle panel and said chip with a silicon adhesive to form a composite panel structure having a plurality of compartments; and cutting said composite panel structure without breaching said chip compartments to form a plurality of chip modules.

7. A method according to claim 6, wherein the adhesive is provided with a gap to permit heated air or moisture to escape the chip modules.

8. A method according to claim 6, wherein the cover panel includes a through-hole to permit heated air or moisture to escape the chip modules.

9. A method according to claim 6, further comprising depositing exterior terminals of a solder material on the outer surface of the base panel at selected positions using a stencil with notches that coincide with locator pins, the exterior solder terminals being connected to the mounted chips by an electrical connection.

10. A method according to claim 6, further comprising supporting the base panel on a carrier plate with three pins and each pin is positioned on a different edge of the carrier plate, and the base panel and the middle panel each have three slots and each slot is positioned on a different edge of the base panel and middle panel, wherein the position of the three pins coincide with the position of the slots as the base panel is adhered to the middle panel.

11. A method according to claim 10, wherein the cover panel has three slots and each slot is positioned on a different edge of the cover panel, wherein the slots of the cover panel coincide with the pins of the carrier plate as the cover panel is adhered to the middle panel.

* * * * *